United States Patent [19]
Nakatsu et al.

[11] Patent Number: 5,255,127
[45] Date of Patent: Oct. 19, 1993

[54] DIGITAL MODULATED SIGNAL DEMODULATOR/DECODER APPARATUS

[75] Inventors: Etsuto Nakatsu, Minoo; Hiroaki Shimazaki; Haruo Ohta, both of Hirakata; Masaaki Kobayashi, Kawanishi, all of Japan

[73] Assignee: Matsushita Electric Industrial Co., Ltd., Osaka, Japan

[21] Appl. No.: 724,888

[22] Filed: Jul. 2, 1991

[30] Foreign Application Priority Data

Jul. 5, 1990 [JP] Japan ................. 2-177714

[51] Int. Cl.⁵ .................. G11B 5/09; G11B 20/06
[52] U.S. Cl. .......................... 360/29; 360/32; 360/39
[58] Field of Search .............. 360/29, 30, 32, 39, 360/46; 329/306

[56] References Cited

U.S. PATENT DOCUMENTS 4,077,021 2/1978 Csajika et al. ............... 332/103
4,403,263 9/1983 Kageyama et al. ............ 360/32

FOREIGN PATENT DOCUMENTS 60-182246 9/1985 Japan.
61-210435 9/1986 Japan.

OTHER PUBLICATIONS

"Digital Video Recording: New Results in Channel Coding and Error Protection", Jurgen K. R. Heitmann, SMPTE Journal, Feb. 1984, pp. 140–144.
"An Analytical Approach to the Standardization of Digital Videotape Recorders", Jurgen K. R. Heitmann, SMPTE Journal, pp. 229–232, Mar. 1982.
"An Experimental Digital VTR Capable of 12–Hour Recording", C. Yamamitsu et al., IEEE Transactions On Consumer Electronics, vol. CE-33, No. 3, Aug. 1977, pp. 240–248.
"An Experimental Digital Video Recording System", L. M. H. E. Driessen et al., IEEE Transactions On Consumer Electronics, vol. CE-32, No. 3, Aug. 1986, pp. 362–371.
"Digital Television Recording with Low Tape Consumption", John L. E. Baldwin, SMPTE Journal, Jul. 1979, vol. 88, pp. 490–492.
"Signal System Design for a Digital Video Recording System", Luigi Gallo, SMPTE Journal, vol. 86, Oct. 1977, pp. 749–756.
"Recording of Quadrature Amplitude-Modulated Signal On Magnetic Recording Channel", Masaaki Kobayashi et al., The Transactions of the IEICE, vol. E73, No. 5, May 1990, pp. 665–669.
"A Study of Multi-Level Signal Recording for Digital VCR", Masaaki Kobayashi et al., ITEJ Technical Report, vol. 13, No. 60, pp. 1–6, Nov. 1989.

Primary Examiner—David Mis
Attorney, Agent, or Firm—Wenderoth, Lind & Ponack

[57] ABSTRACT

In transmission or recording of a digital signal by means of digital amplitude and phase modulation, particularly recording into and reproducing the same from the a magnetic recording medium, a digital amplitude/phase modulated signal to be demodulated is commonly affected by the non-linear amplitude characteristics and the effects of unwanted jitter and envelope variation. As the result, the error rate of decoded data will be increased. For compensation, the Viterbi decoding technique is employed with the use of a weighted distance value calculated by multiplying an Euclidean distance between the signal point of a reproduction signal and the datum point of each code by a positive weighting factor which is determined smaller when the code datum point is located further from the origin point of a coordinate system. Accordingly, the weighted distance of each reproduction signal point from its corresponding datum point can approximately be uniform thus ensuring less error decoding in general.

8 Claims, 8 Drawing Sheets

DIGITAL MODULATED SIGNAL DEMODULATOR/DECODER APPARATUS

BACKGROUND OF THE INVENTION

1. Field of the Invention

The present invention relates to a digital modulated signal demodulator/decoder apparatus for demodulating and decoding a modulated reproduction signal of digital form, e.g. a reproduced signal from a magnetic recording medium, which tends to have high distortion and cause unwanted jitter and envelope variation.

2. Description of the Prior Art

In conventional digital signal magnetic recording/reproducing apparatuses, due to the difficulty of recording/reproducing the direct current component, there have been used baseband modulations having less direct component in the recording signals, such as NRZ codes (e.g., J.K.R. Heitmann "An Analitical Approach to the Standardization of Digital Video Tape Recorder," SMPTE J., 91,3, Mar. 1982, or J.K.R. Heitmann "Digital Video Recording, New Result in Channel Coding and Error Protection," SMPTE J., 93:140-144, Feb. 1984), 8-10 block codes (e.g., J.L.E. Baldwin "Digital Television Recording with Low Tape Consumption," SMPTE J., 88:490-492, Jul. 1979), Miller-square ($M^2$) codes (e.g., L. Gallo "Signal System Design for a Digital Video Recording System," SMPTE J., 86:749-756, Oct. 1977), ternary partial response system, etc.

However, in the digital signal magnetic recording/reproducing apparatus utilizing such base band modulations, due to the basic system of recording the binary signals, utilization efficiency of the recording frequency band (transmission bit rate per unit band) is low. For instance, assuming the roll-off rate of the nykist transmission system to be 0.5, the utilization efficiency of the frequency band is at most 1.33 bits/sec./Hz. This incurs an increased tape consumption, providing a difficulty to long time recording. Further, in order to increase the recording rate, there can be considered a method of increasing the number of recording channels, or a method of increasing the relative velocity. However, if the recording frequency band is expanded, S/N ratio is extremely deteriorated. Accordingly, the recording rate cannot be increased so much. When the number of recording channels is increased, the track width is narrowed and S/N ratio is deteriorated. If the relative velocity is increased, the amount of tape consumption naturally comes into question.

To the deterioration of the S/N ratio, the error rate may be improved by using the error control coding. However, the bit rate of the data which can be actually recorded is lost by such coding (Ref. L.M.H.E. Dreissen et al., "An Experimental Digital Video Recording System," IEEE Conf. Jun. 1986, or C. Yamamitsu et al., "An Experimental Digital VTR Capable of 12-hour Recording," IEEE Trans. on CE,CE-33, No.3, pp 240-248, 1987).

On the other hand, there has been proposed a modulation scheme made by combining a multi-value modulation scheme, which shows a high utilization efficiency of the frequency band, with an error control coding for application to the digital data transmission. This, however, does not give consideration on the special conditions such as the effect of non-linear distortion or the effect of saturation characteristics in the case of making recording/producing on a magnetic recording medium (cf. G. Ungerboeck "Channel Coding with Multilevel/-phase Signals," IEEE Trans. on IT, IT-28, No.1, pp. 55-67, 1982).

We, the inventors of the present invention, have invented a digital magnetic recording/reproducing apparatus employing an improved amplitude/phase modulation system which is highly enhanced in the frequency efficiency and the recording rate, as described in more detail in U.S. patent application Ser. No. 07/302,325 now Pat. No. 5,095,392. However, the amplitude non-linear characteristics and the effects of jitter and envelope variation which may be caused during playback operation of magnetic recording data have not been considered.

SUMMARY OF THE INVENTION

It is an object of the present invention to provide a digital modulated signal demodulator/decoder apparatus in which a digital modulated signal which is affected by the non-linear amplitude characteristics and the effects of unwanted jitter and envelope variation can be demodulated and decoded at a low error rate.

For achievement of the foregoing object, a digital modulated signal demodulator/decoder apparatus of the present invention comprises: a demodulating means for receiving and demodulating an amplitude/phase modulated signal of digital form obtained through amplitude/phase modulation of a series of digital data processed by convolutional encoding to first and second demodulated signals with two different carrier waves which are 90-degree out of phase from each other; a first sampling means for sampling the first demodulated signal at a timing of code identification; a second sampling means for sampling the second demodulated signal at the timing of code identification; a weighting factor calculating means for identifying codes of the first and second demodulated digital signals supplied from the first sampling means and the second sampling means, respectively, and then, calculating a reciprocal number of a standard deviation which represents statistical variations of digital demodulated signal values identified as having a same code, the reciprocal number being outputted as a weighting factor corresponding to the code; a weighted branch-metric calculating means for on receiving the first and second demodulated digital signals, multiplying by the weighting factor from the weighting factor calculating means an Euclidean distance between a signal point defined by the two demodulated digital signals and a reference signal point determined by the code to calculate a weighted distance which is in turn squared for output as a branch-metric value; an add/compare/select means for summing branch-metric values fed from the weighted branch-metric calculating means, comparing resultant branch-metric sums corresponding to all signal strings which may follow a given number of preparatory signal strings stored in a pass memory for selection of an output signal, and delivering a result of the comparison; and the pass memory having stored therein the given number of signal strings for selection of an output signal and delivering a signal value determined by the comparison result fed from the add/compare/select means while storing another group of signal strings supplied from the add/compare/select means for selection of the succeeding output signal.

Accordingly, even when a demodulated reproduction signal which has been reproduced through demodulating the digital modulated signal affected by the non-linear amplitude characteristics and having jitter and envelope variation carries distortion or its codes are not uniform in the deviation of the signal point, the Viterbi decoding technique using weighted Euclidean distance will provide decoded data having less error.

DESCRIPTION OF THE PREFERRED EMBODIMENTS

Figure 1:
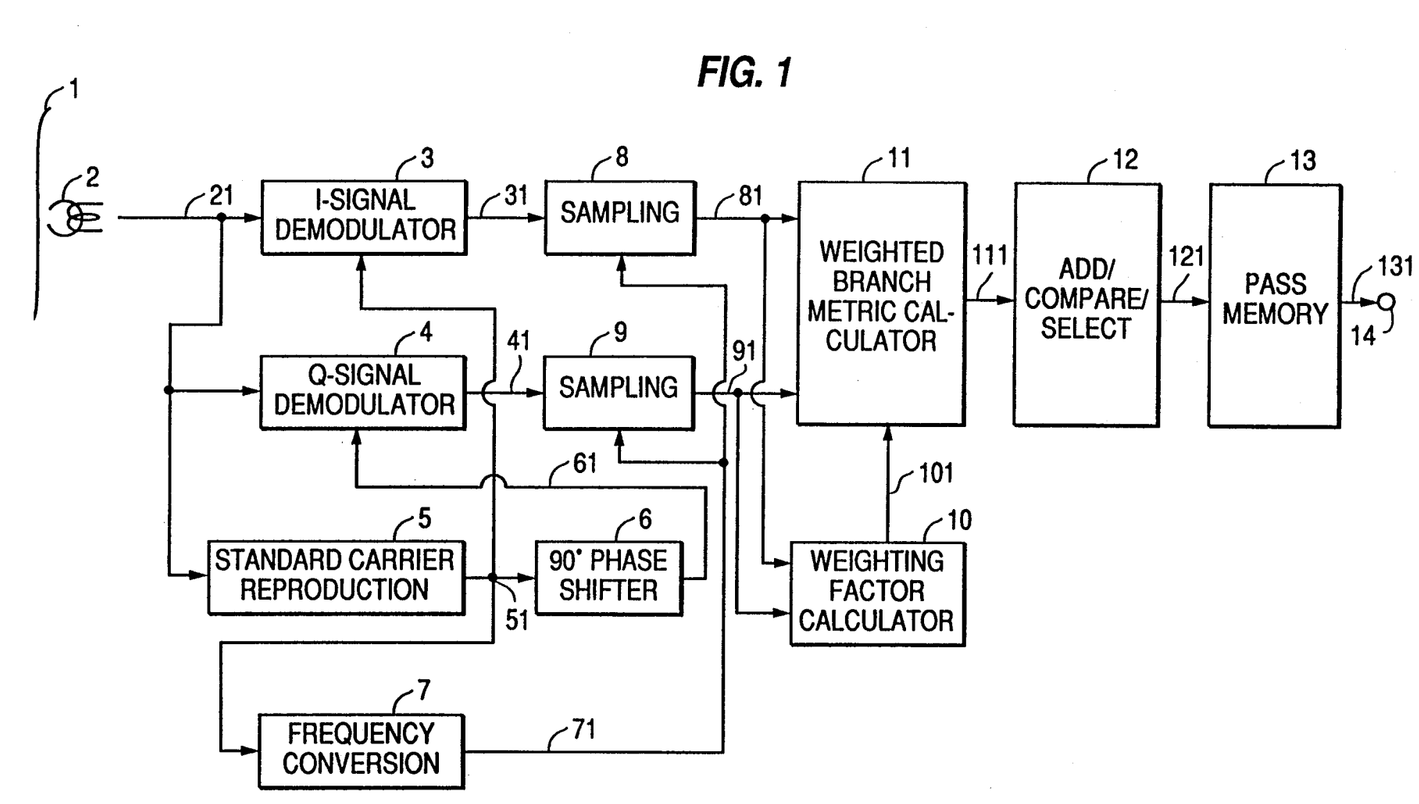
FIG. 1 is a block diagram of a digital modulated signal demodulator/decoder apparatus showing a first embodiment of the present invention.
Figure 3:
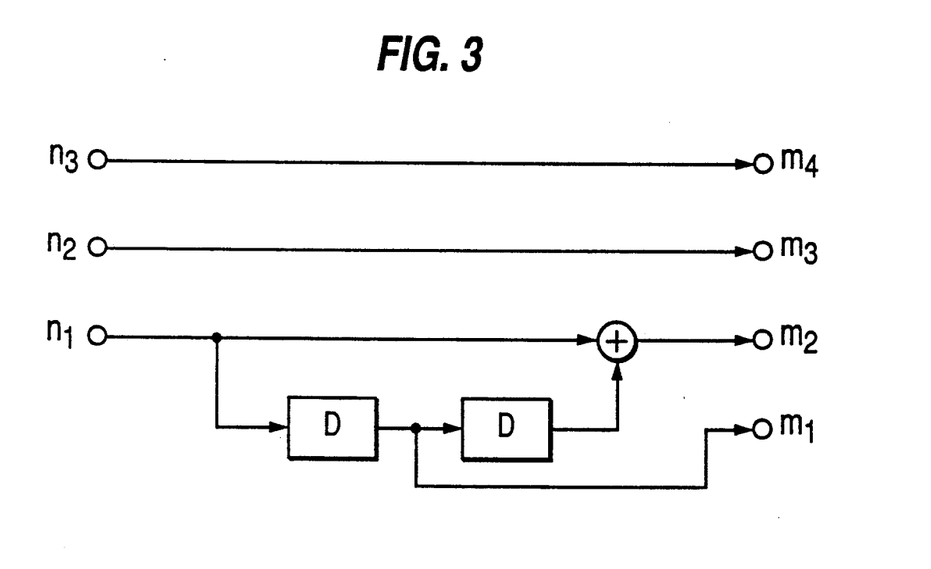
FIG. 3 is a block diagram showing a convolutional decoder for coded modulation.
Figure 6:
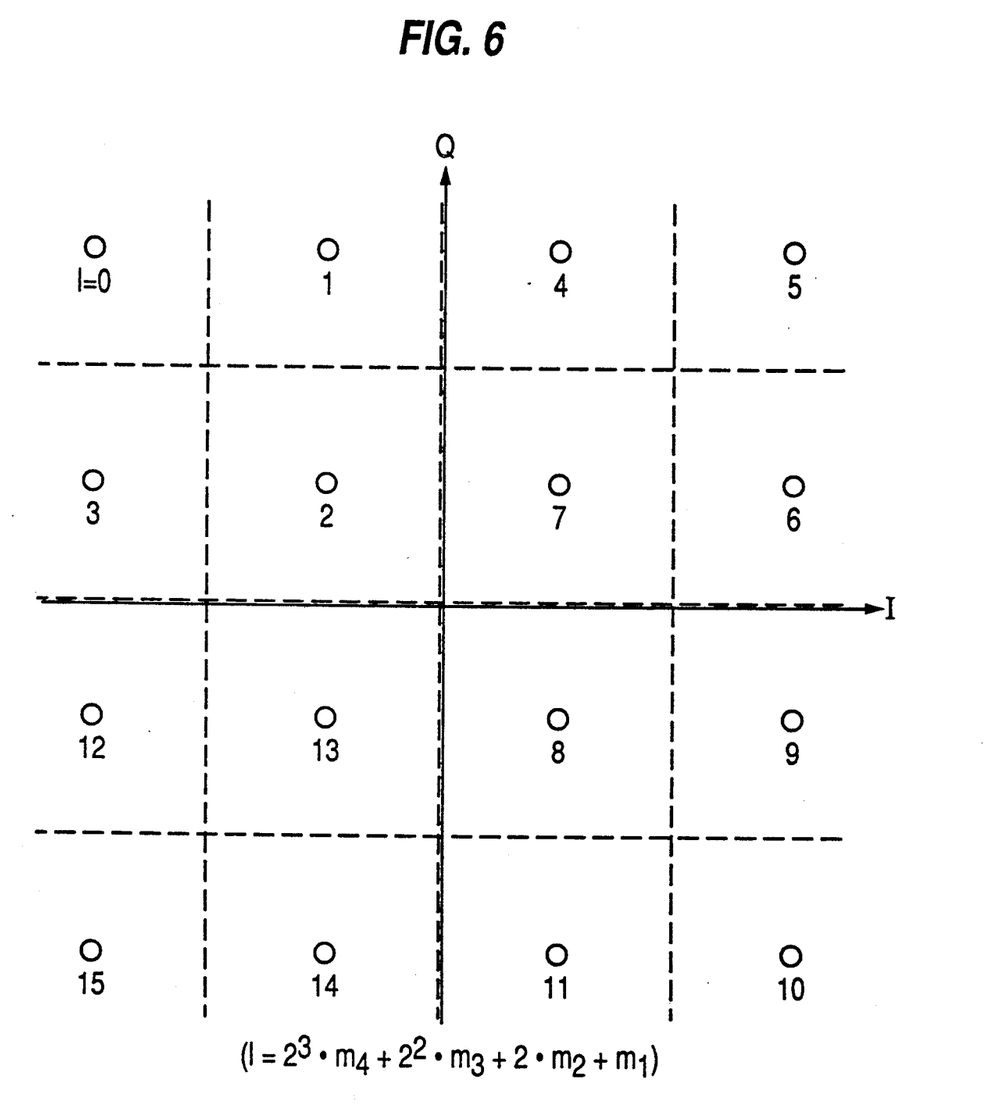
FIG. 6 is a graphic diagram showing a corresponding number of discrete regions on an I/Q plane for identifying the allocation of demodulated reproduction data to the signal points of a 16-QAM (quadrature amplitude modulation) signal in the weighting factor calculator circuit.

Preferred embodiments of the present invention will be described referring to the accompanying drawings. FIG. 1 illustrates a first embodiment in which a magnetic recording medium 1 (e.g. a magnetic tape) carries an amplitude/phase shift keying (APSK) signal or a composite modulated signal which is produced by combining a digital signal component amplitude modulated with a standard carrier wave after convolutional encoding of a series of digital data and a similar digital signal component amplitude modulated with another carrier which is 90°. out of phase relative to the standard carrier. For example, one of the typical APSK signals is a 16-QAM signal consisting of an I signal component produced by amplitude modulating at four levels with a standard carrier a 4-bit code signal ($m_1$, $m_2$, $m_3$, $m_4$), which is converted with a convolutional encoder from a 3-bit code signal ($n_1$, $n_2$, $n_3$) as shown in FIG. 3, and a Q signal component produced by amplitude modulating the same at four levels with another carrier which is 90°. out of phase relative to the standard carrier. The letter D shown in FIG. 3 represents a delayer. The 16-QAM modulated signal carries 16 different forms of amplitude/phase information (denoted by the "o" marks of the IQ plane in FIG. 6) corresponding to sixteen 4-bit codes (0000, 0001, . . . 1111). As shown in FIG. 6, a signal point assigned to each 4-bit code is expressed by:

$$1 = 2^3 \cdot m_4 + 2^2 \cdot m_3 + 2m_2 + m_1.$$

Hence, the amplitude/phase modulated signal to be recorded contains a plurality of amplitude data and its attenuation caused by signal distortion should preferably be minimized with the use of AC bias recording. More preferably, the bias frequency may be determined equal to or more than three times the maximum value $f_H$ of a signal frequency in order to maintain a cross modulation factor between the bias signal and the amplitude/phase modulated signal out of the signal band.

As shown in FIG. 1, an amplitude/phase modulated signal 21 is reproduced by a magnetic recording/reproducing device comprising a magnetic recoding medium 1 and a magnetic head 2 and fed to an I-signal demodulator circuit 3, a Q-signal demodulator circuit 4, and a standard carrier reproducing circuit 5 respectively.

At the standard carrier reproducing circuit 5, a standard carrier wave 51 is retrieved from the modulated reproduction signal 21. The standard carrier reproducing circuit 5 may be arranged by such a manner as explained in the report; "Channel Coding with Multilevel/Phase Signals" by G. Ungerboeck, IEEE Trans. on IT, IT-28, No.1, pp. 55-67, 1982. The standard carrier 51 retrieved is then transferred to the I-signal demodulator circuit 3 and also, to a 90-degree phase shifter circuit 6 and a frequency converter circuit 7. The 90-degree phase shifter circuit 6 advances 90°. the phase of the standard carrier 51 to produce a 90-degree phase shifted carrier wave 61 which is fed to the Q-signal demodulator circuit 4.

The frequency converter circuit 7 produces a clock signal 71 through frequency conversion of the standard carrier 51. The clock signal 71 is then fed to two sampling circuits 8 and 9.

The I-signal demodulator circuit 3 performs multiplication of the modulated reproduction signal 21 and the standard carrier 51 to produce a demodulated I-signal 31. Similarly, the Q-signal demodulator circuit 4 multiplies the modulated reproduction signal 21 and the 90° phase shifted carrier 61 to produce a demodulated Q-signal 41.

Figure 7:
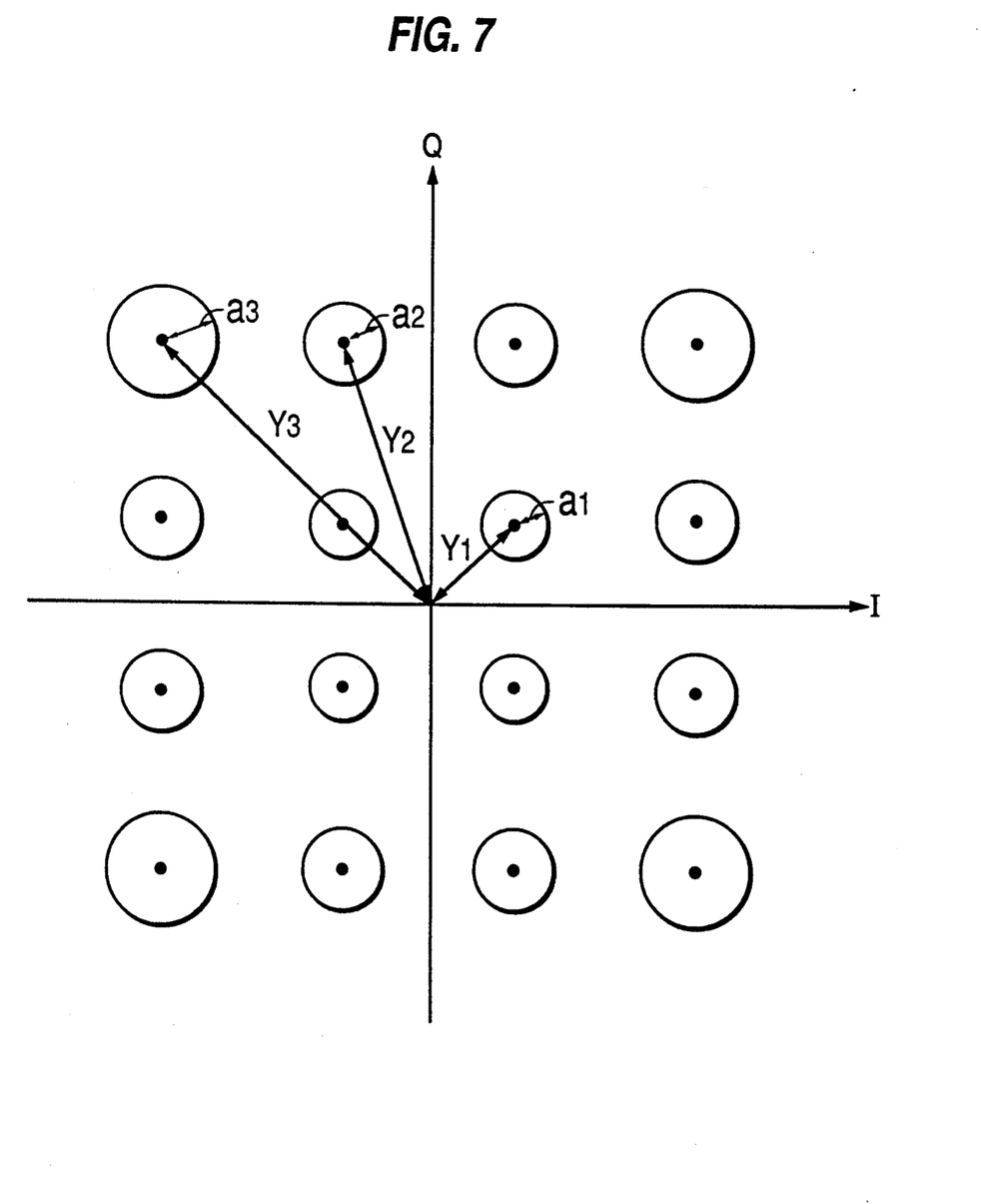
FIG. 7 is a graphic diagram showing the dispersion of the signal points of the demodulated reproduction signal with reference to the origin point of the 16-QAM signal.
Figure 8:
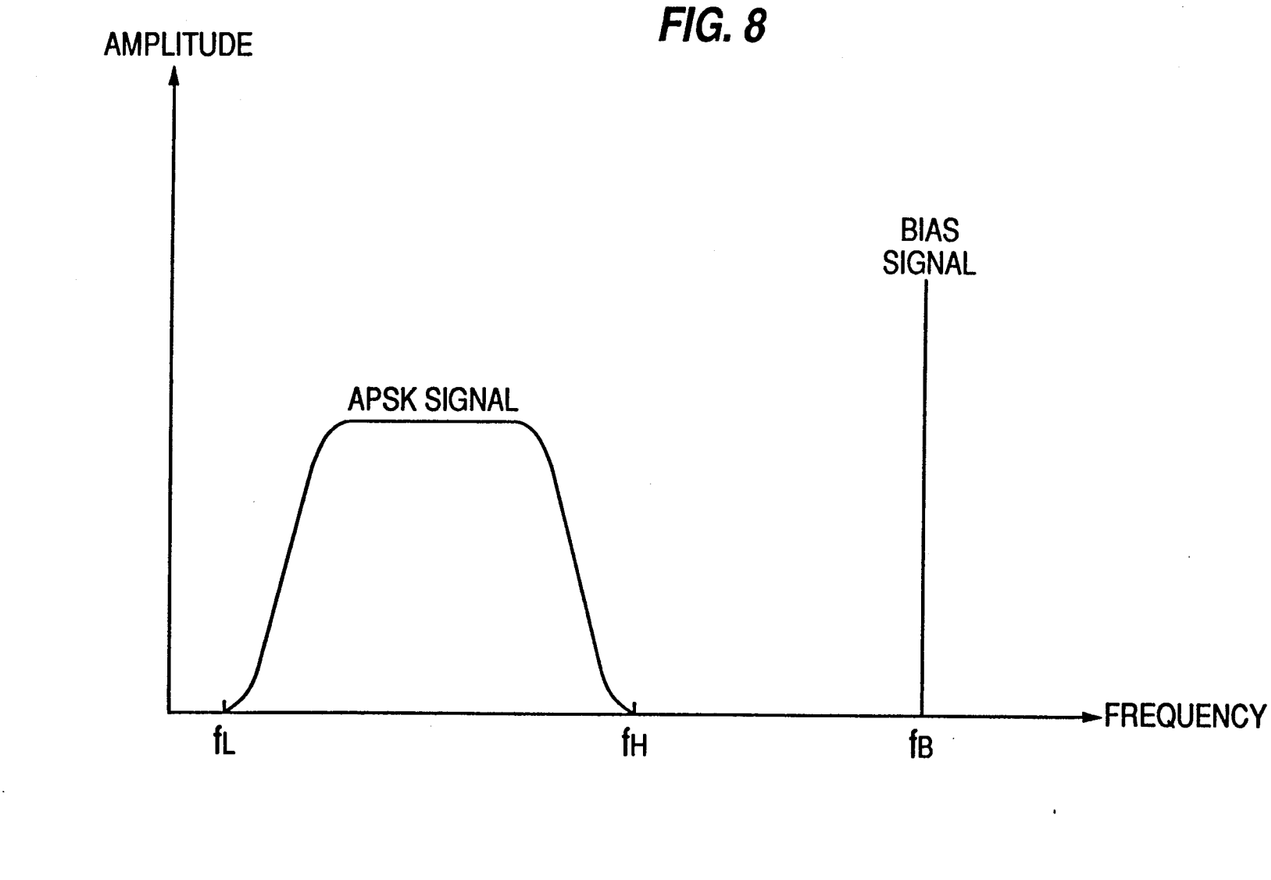
FIG. 8 is a graphic diagram showing the frequency allocation of a recording signal in AC bias recording of an amplitude/phase modulated signal.

The demodulated I-signal 31 is sampled in synchronism with the clock signal 71 by a sampling circuit 8 to have a demodulated I-data 81. Also, the demodulated Q-signal 41 is sampled in synchronism with the clock signal 71 by another sampling circuit 9 to have a demodulated Q-data 91. The dispersion of the demodulated I- and Q-data for each 4-bit code is expressed by a circle on the IQ plane, as shown in FIG. 7. It is thus apparent that the greater the amplitude or the further the signal center point from the origin point, the more the dispersion of code components of the demodulated reproduction signal is increased. When the modulated reproduction signal is a 16-QAM signal, its 4-bit code amplitudes are classified into three levels; from the smallest, $r_1$, $r_2$, and $r_3$. Hence, the standard deviations $a_1$, $a_2$, and $a_3$ representing variations of the dispersion of their respective signal points are expressed as $a_1 < a_2 < a_3$. Both the demodulated I- and Q-data 81 and 91 are then fed to a weighting factor calculator circuit 10 to reckon the reciprocal number of the standard deviation of each demodulated IQ data point which is identified as being derived from the same 4-bit code. The information of the reciprocal numbers is then transferred as a weighting factor 101 to a weighted branch-metric calculator circuit 11.

Figure 4:
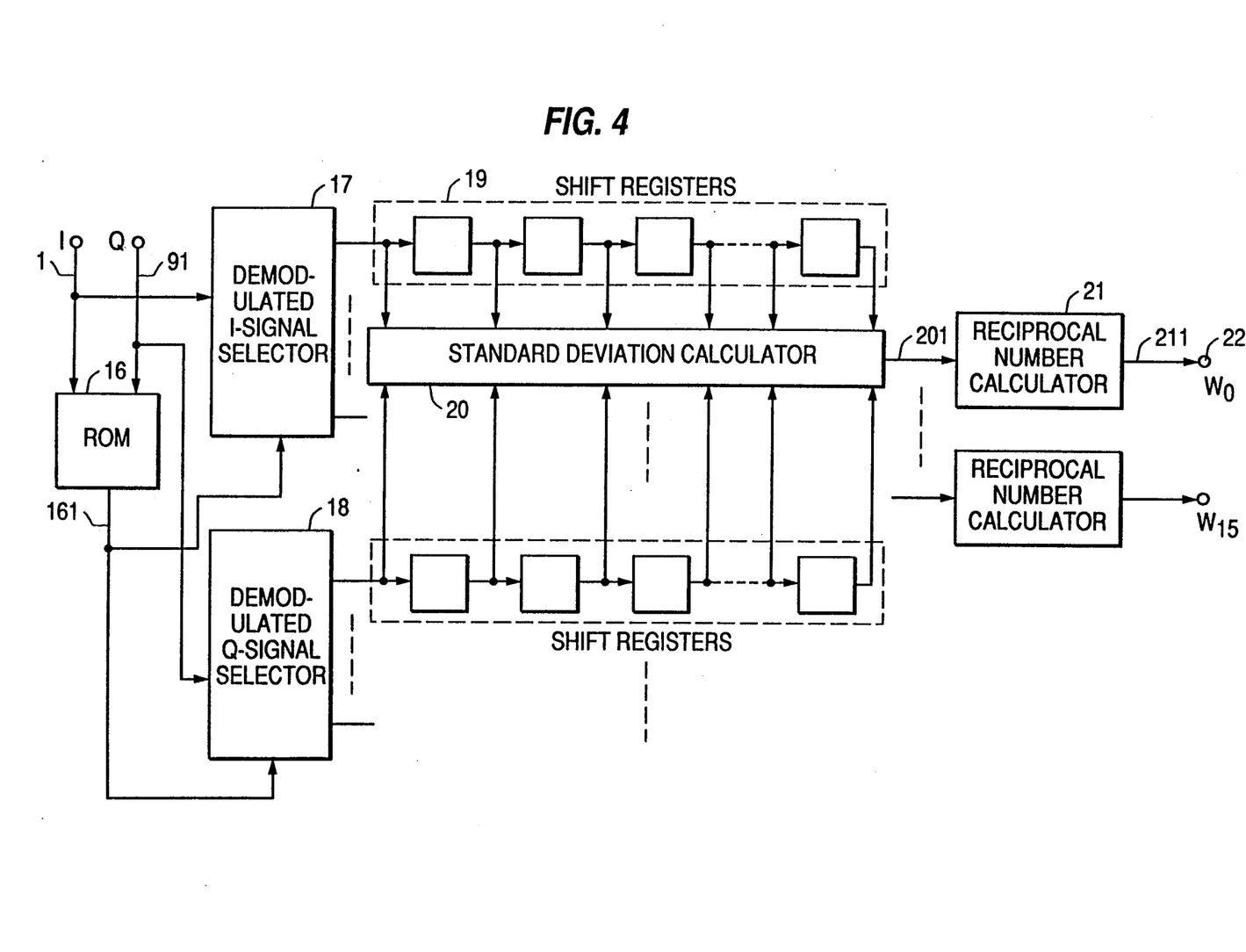
FIG. 4 is a block diagram showing a weighting factor calculator circuit in the digital modulated signal demodulator/decoder apparatus of the present invention.

The operation of both the weighting factor calculator circuit 10 and the weighted branch-metric calculator circuit 11 with the 16-QAM reproduction signal will now be described in more detail referring to the drawings. FIG. 4 is a block diagram showing the weighting factor calculator circuit 10. A ROM 16 holds data for the assignment of all combinations of the I-data and the Q-data to 16 discrete regions which are equally allocated on the IQ plane as defined by the dotted lines of FIG. 6. The demodulated I- and Q-data 81 and 91 are fed to the ROM 16 which in turn delivers a code identification result signal 161 indicating a corresponding 4-bit code to the demodulated IQ data point located at one of the 16 regions. The code identification result signal 161 is then supplied to both a demodulated I-data selector 17 and a demodulated Q-data selector 18. Consequently, the demodulated I-data 81 is assigned to a corresponding one of sixteen I-data shift registers 19 in accordance with the code identification result signal 161 and also, the demodulated Q-data 91 is assigned to a corresponding one of sixteen Q-data shift registers. As the result, a series of the demodulated I-data identified as being derived from the same 4-bit code are stored in the same I-data shift register and a series of the demodulated Q-data in the same Q-data shift register. The magnitude of a standard deviation 201 is now calculated by a standard deviation calculator circuit 20 from the data for each 4-bit code stored in the shift register. When the center point of each 4-bit code circle is designated as (In, Qn) where n=0 to 15 and an m number of IQ points identified as derived from the same 4-bit code are expressed as $(In_1, Qn_1)$ to $(Inm, Qnm)$ respectively, the standard deviation $\sigma n$ is thus calculated from:

$$\sigma n = \sqrt{\frac{1}{m} \sum_{i=1}^{m} \{(Ini - In)^2 + (Qni - Qn)^2\}}$$

The standard deviation $\sigma n$, 201, of each of sixteen discrete 4-bit codes is transferred to a reciprocal number calculator circuit 21 which calculates a weighting factor $Wn = 1/\sigma n$ represented by 211 in FIG. 4.

Figure 5:
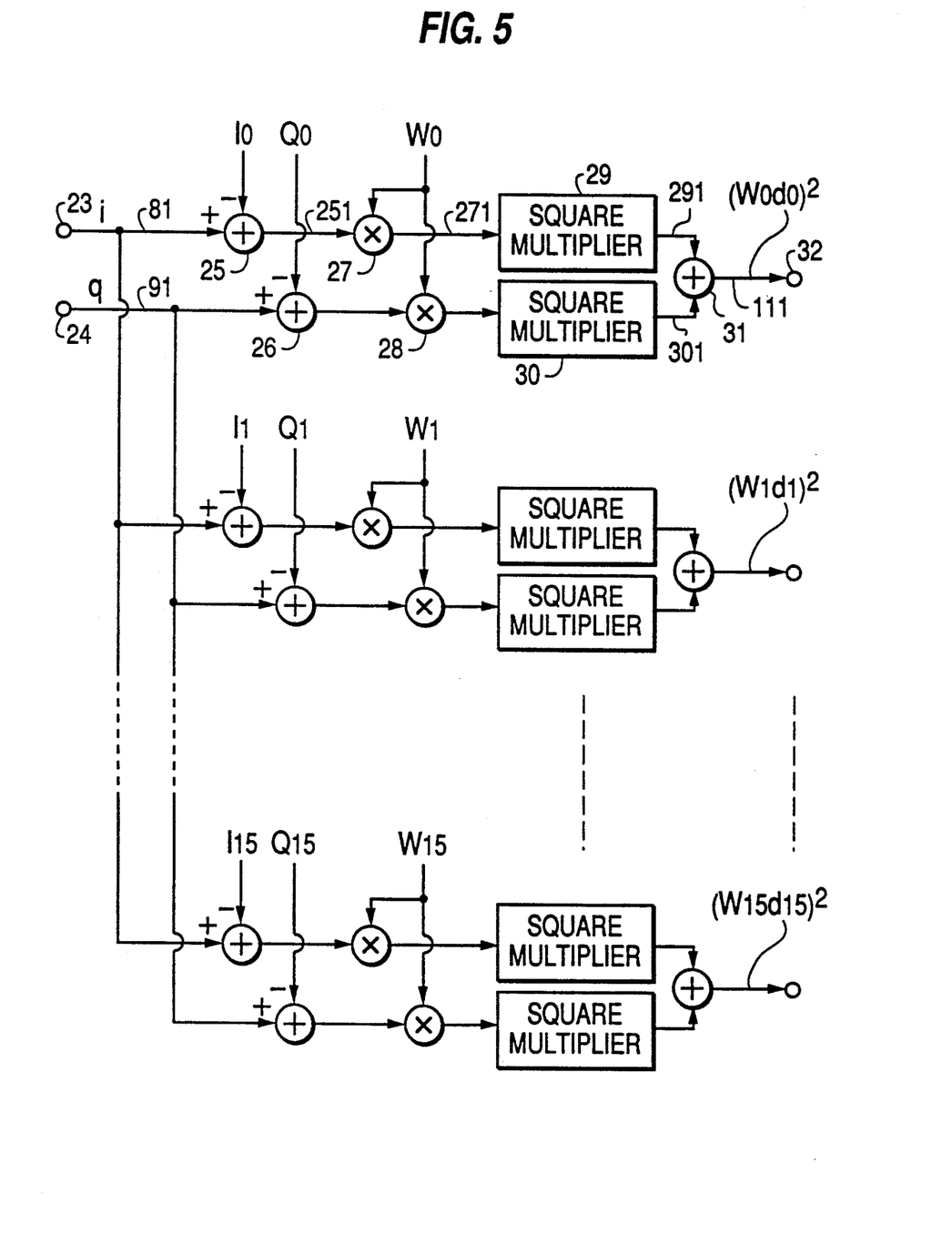
FIG. 5 is a block diagram showing a weighted branch-metric calculating circuit in the digital modulated signal demodulator/decoder apparatus of the present invention.

FIG. 5 is a block diagram showing in more detail the weighting branch-metric calculator circuit 11. When the demodulated reproduction signal point defined by the I-signal 81 and the Q-signal 91 is at (i,q), its distance 251 ($=i-In$) extending from the center point (In, Qn) in the I direction is reckoned by an adder 25 and then, its weighted distance 271 ($=Wn(i-In)$) is calculated by a multiplier Furthermore, the square 291 of the weighted distance ($=Wn^2(i-In)^2$) is calculated by a square multiplier 29. Similarly, a weighted square distance 301 ($=Wn^2(g-Qn)^2$) associated with the Q direction is reckoned by calculation with an adder 26, a multiplier 28, and a square multiplier 30. The two weighted square distance values 291 and 301 are summed by an adder 31 to a branch-metric output 111.

The branch-metric output 111 is transferred to an add/compare/selecting circuit 12 where it is accumulated to a branch-metric sum. The branch-metric sums corresponding to the entire strings of signals which may follow a given number of signal strings stored in a pass memory 13 for selection of an output signal, are compared from one another, and the least branch-metric sum of a signal string is selected and supplied as a selected data 121 to the pass memory 13. The pass memory 13 delivers a signal value which is retrieved from the signal string designated by the selected data 121 and has been assigned at the earliest time for memory in the pass memory 13 as an output signal 131 to an output terminal 14. At the same time, the pass memory 13 stores a plurality of the signal strings, one of which becomes the succeeding output signal. Such a Viterbi decoder comprising a branch-metric calculator circuit 11, an add/compare/select circuit 12, and a pass memory 13 has been developed by us for practical use as disclosed in U.S. patent application Ser. No. 07/302 325 (filed on Jan. 27, 1989) now Pat. No. 5,095,392.

Figure 2:
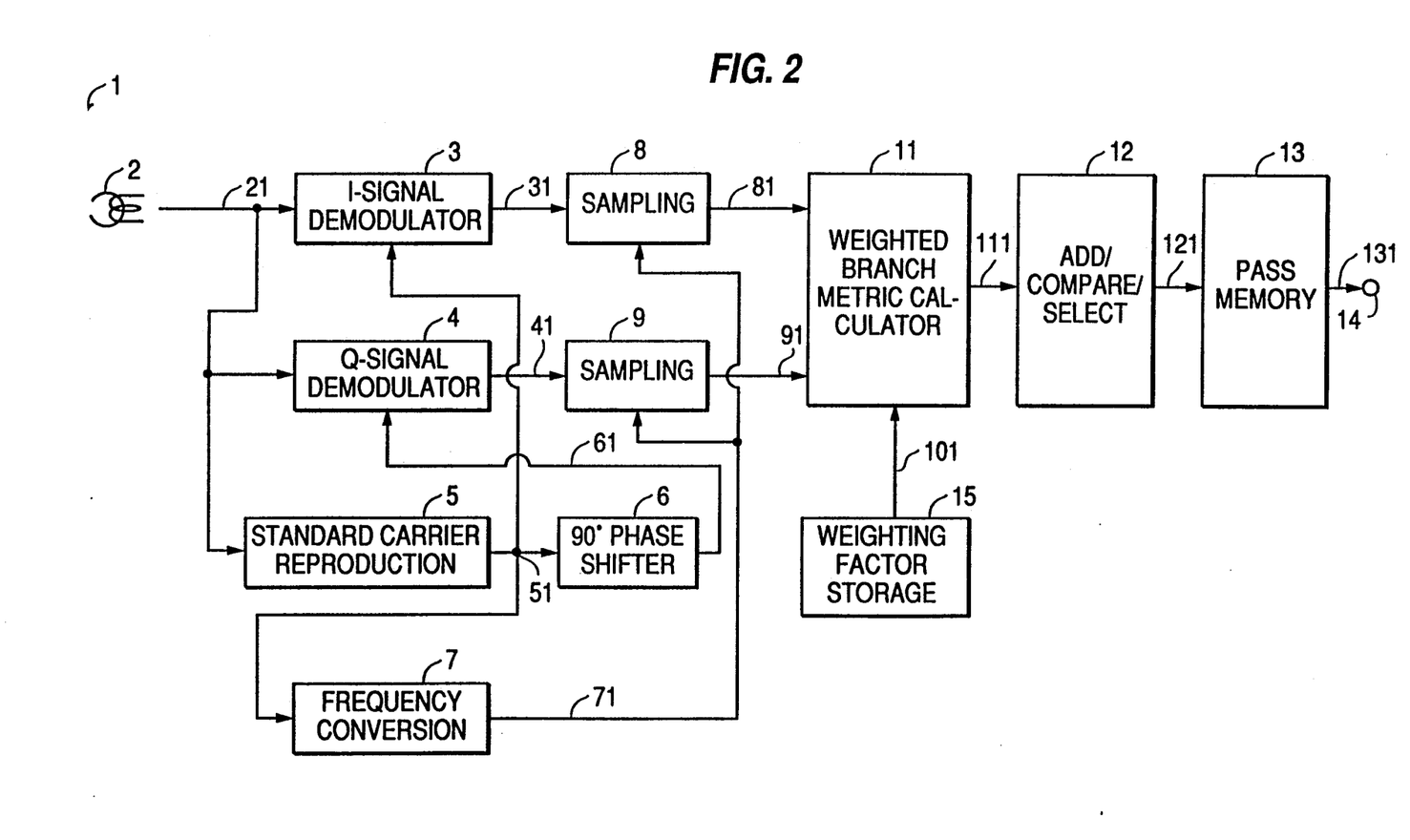
FIG. 2 is a block diagram of a digital modulated signal demodulator/decoder apparatus showing a second embodiment of the present invention.

FIG. 2 illustrates a second embodiment of the present invention in which the Viterbi decoding is carried out using a predetermined weighting factor Wn, unlike the first embodiment allowing the weighting factor calculator circuit 10 to calculate the weighting factor Wn (n=1 to 15) from the two demodulated reproduction signals 81 and 91. In this case, the predetermined factor Wn is preliminary stored in a weighting factor memory circuit 15. The weighting factor memory circuit 15 comprises a ROM arranged for holding and delivering the weighting factors Wn corresponding to sixteen different 4-bit codes. The other components in the second embodiment are identical to those of the first embodiment.

Although the modulated reproduction signals employed in both the first and second embodiment are described in the form of 16-QAM signals which are convolutionally encoded, they may be other digital amplitude/phase modulated signals such as 8-PSK (phase-shift keying) signals with equal success.

What is claimed is:

1. A digital modulated signal demodulator/decoder apparatus comprising:
    a demodulating means for receiving and demodulating an amplitude/phase modulated signal of digital form obtained through amplitude/phase modulation of a series of digital data processed by convolutional encoding to first and second demodulated signals with two different carrier waves which are 90-degree out of phase from each other;
    a first sampling means for sampling the first demodulated signal at a timing of code identification;
    a second sampling means for sampling the second demodulated signal at the timing of code identification;
    a weighting factor calculating means for identifying codes of the first and second demodulated digital signals supplied from the first sampling means and the second sampling means respectively and then, calculating a reciprocal number of a standard deviation which represents statistical variations of a digital demodulated signal value identified as having the same code, for output as a weighting factor corresponding to the code;
    a weighted branch-metric calculating means for on receipt of the two, first and second demodulated digital signals, multiplying by the weighting factor from the weighting factor calculating means an Euclidean distance between a signal point defined by the two demodulated digital signals and a reference signal point determined by the code to calculate a weighted distance which is in turn squared for output as a branch-metric value;
    add/compare/select means for summing branch-metric values fed from the weighted branch-metric calculating means, comparing resultant branch-metric sums corresponding to all signal strings which may follow a given number of preparatory signal strings stored in a pass memory for selection of an output signal, and delivering a result of the comparison; and said pass memory having stored therein a given number of signal strings for selection of an output signal and delivering a signal value determined by the comparison result fed from the add/compare/select means while storing another group of signal strings supplied from the add/compare/select means for selection of the succeeding output signal.

2. An apparatus according to claim 1, wherein the amplitude/phase modulated signal of digital form is reproduced by a magnetic recording/reproducing means including a magnetic head and a magnetic recording medium.

3. An apparatus according to claim 1, wherein the amplitude/phase modulated signal of digital form is recorded by means of superimposition on a bias signal which has a frequency higher than a maximum frequency of the amplitude/phase modulated signal and then, reproduced with the use of a magnetic recording/reproducing means including a magnetic head and a magnetic recording medium.

4. An apparatus according to claim 3, wherein the bias signal has a frequency of equal to or more than three times the maximum frequency of the amplitude/phase modulated signal.

5. A digital modulated signal demodulator/decoder apparatus comprising:

a decoding means for receiving and demodulating an amplitude/phase modulated signal of digital form obtained through amplitude/phase modulation of a series of digital data processed by convolutional encoding to first and second demodulated signals with the use of two different carrier waves which are 90-degree out of phase from each other;

a first sampling means for sampling the first demodulated signal at a timing of code identification;

a second sampling means for sampling the second demodulated signal at the timing of code identification;

a weighted branch-metric calculating means for on receipt of the two, first and second demodulated digital signals supplied from the first sampling means and the second sampling means respectively, multiplying an Euclidean distance between a signal point defined by the two demodulated digital signals and a reference signal point determined by a predetermined code by a positive weighting factor, which is determined smaller when the amplitude at the reference signal point is greater, in order to calculate a weighted distance which is in turn squared for output as a branch-metric value;

an add/compare/select means for summing the branch metric values fed from the weighted branch-metric calculating means, comparing resultant branch-metric sums corresponding to all signal strings which may follow a given number of preparatory signal strings stored in a pass memory for selection of an output signal, and delivering a result of the comparison; and said pass memory having stored therein a given number of signal strings for selection of an output signal and delivering a signal value determined by the comparison result fed from the add/compare/select means while storing another group of signal strings supplied from the add/compare/select means for selection of the succeeding output signal.

6. An apparatus according to claim 5, wherein the amplitude/phase modulated signal of digital form is reproduced by a magnetic recording/reproducing means including a magnetic head and a magnetic recording medium.

7. An apparatus according to claim 5, wherein the amplitude/phase modulated signal of digital form is recorded by means of superimposition on a bias signal which has a frequency higher than a maximum frequency of the amplitude/phase modulated signal and then, reproduced with the use of a magnetic recording/reproducing means including a magnetic head and a magnetic recording medium.

8. An apparatus according to claim 7, wherein the bias signal has a frequency of equal to or more than three times the maximum frequency of the amplitude/phase modulated signal.

* * * * *